12) United States Patent
Shon

(10) Patent No.: US 8,773,175 B2
(45) Date of Patent: Jul. 8, 2014

(54) SIGNAL TRANSMISSION CIRCUIT FOR ENHANCING SIGNAL INTEGRITY

(71) Applicant: SK hynix Inc., Icheon-si (KR)

(72) Inventor: Kwan Su Shon, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/719,016

(22) Filed: Dec. 18, 2012

(65) Prior Publication Data
US 2014/0049306 A1 Feb. 20, 2014

(30) Foreign Application Priority Data
Aug. 20, 2012 (KR) .................. 10-2012-0090935

(51) Int. Cl.
H03K 3/00 (2006.01)
(52) U.S. Cl.
USPC ............................................ 327/108; 326/30
(58) Field of Classification Search
USPC ............................................ 327/108; 326/30
See application file for complete search history.

(56) References Cited

U.S. PATENT DOCUMENTS 7,091,761 B2 * 8/2006 Stark et al. .................... 327/170
7,557,615 B1 * 7/2009 Tran et al. ...................... 326/82
7,719,314 B1 * 5/2010 Jiang et al. ..................... 326/83

FOREIGN PATENT DOCUMENTS

KR 1020090114630 A 11/2009
KR 1020100043971 A 4/2010

* cited by examiner

Primary Examiner — Kenneth B. Wells
(74) Attorney, Agent, or Firm — William Park & Associates Patent Ltd.

(57) ABSTRACT

A signal transmission circuit includes a pre-driver and a driver. The pre-driver is configured to generate a first drive signal in response to a first delay signal and a first selection signal and to generate a second drive signal in response to a second delay signal, a second selection signal, and a pulse signal. The driver is configured to drive a transmission signal in response to the first and second drive signals. The first delay signal is enabled at a second time which is later than a first time when an input signal is received, the second delay signal is enabled at a third time which is later than the second time, and the pulse signal is enabled at a fourth time which is delayed by a predetermined delay period from the first time.

23 Claims, 9 Drawing Sheets

FIG.9

|  | $\frac{R}{2}$ | R |
|---|---|---|
| First Pull-up Pre-driver | ON | ON |
| Second Pull-up Pre-driver | ON | ON → OFF |
| First Pull-down Pre-driver | ON | ON |
| Second Pull-down Pre-driver | ON | ON → OFF |

SIGNAL TRANSMISSION CIRCUIT FOR ENHANCING SIGNAL INTEGRITY

CROSS-REFERENCE TO RELATED APPLICATION

The present application claims priority under 35 U.S.C 119(a) to Korean Application No. 10-2012-0090935, filed on Aug. 20, 2012, in the Korean Intellectual Property Office, which is incorporated herein by reference in its entirety as set forth in full.

BACKGROUND

In general, a transmitting stage or a receiving stage of a semiconductor integrated circuit is connected to a termination resistor having the same resistance as an impedance of a transmission channel. The termination resistor may match the impedance of the transmission channel with the impedance of the transmitting or receiving stage to suppress reflection of signals (including data) transmitted through the transmission channel.

In integrated circuits such as central processing units (CPUs) and/or graphic memory devices having a relatively smaller power consumption constraint, the termination resistor electrically connected to the receiving stage has been widely employed to effectively suppress the signal reflection. However, in the event that the termination resistor is electrically connected to the receiving stage, a direct current (DC) always flows through the termination resistor, drawing high power consumption. Thus, it may be difficult to use the design scheme employing the termination resistor connected to the receiving stage in some integrated circuits such as mobile devices or systems having a relatively greater power consumption constraint. Accordingly, the integrated circuits of the mobile devices or systems employ a design scheme where the termination resistor is connected to the transmitting stage.

The design scheme having the termination resistor connected to the transmitting stage may be realized using a signal transmission circuit. More specifically, the integrated circuits may include the signal transmission circuit that is connected to the transmitting stage to transmit the signals through the transmission channel so that the impedance of the signal transmission channel may be matched by controlling an electrical resistance of the signal transmission circuit. The signal transmission circuit may include a plurality of drivers for driving the signals transmitted through the transmission channel. The electrical resistance of the signal transmission circuit may be adjusted or controlled by selectively turning on at least one of the plurality of drivers.

SUMMARY

Various embodiments are directed to signal transmission circuits.

According to an embodiment, a signal transmission circuit includes a pre-driver and a driver. The pre-driver is configured to generate a first drive signal in response to a first delay signal and a first selection signal and to generate a second drive signal in response to a second delay signal, a second selection signal, and a pulse signal. The driver is configured to drive a transmission signal in response to the first and second drive signals. The first delay signal is enabled at a second time which is later than a first time when an input signal is received, the second delay signal is enabled at a third time which is later than the second time, and the pulse signal is enabled at a fourth time which is delayed by a predetermined delay period from the first time.

According to another embodiment, the pre-driver is configured to generate an enabled drive signal when a delay signal is enabled when a selection signal is enabled or when a pulse signal is disabled and the delay signal is enabled when the selection signal is disabled, and the driver is configured to drive a transmission signal in response to the drive signal.

According to another embodiment, a signal transmission circuit includes an input buffer, a signal processor, a pre-driver, and a driver. The input buffer is configured to generate a pre-signal and a trigger signal in response to an input signal. The signal processor is configured to generate a pulse signal in response to the pre-signal and to generate a first delay signal and a second delay signal in response to the trigger signal. The pre-driver is configured to generate a first drive signal in response to the first delay signal and a first selection signal and to generate a second drive signal in response to the second delay signal, a second selection signal, and the pulse signal. The driver is configured to drive a transmission signal in response to the first and second drive signals.

BRIEF DESCRIPTION OF THE DRAWINGS

Embodiments of the inventive concept will become more apparent in view of the attached drawings and accompanying detailed description, in which:

FIG. 9 is a table in which operation statuses of first and second pull-up pre-drivers and first and second pull-down pre-drivers included in the signal transmission circuit of FIG. 2 are summarized according to electrical resistances of the signal transmission circuit.

DETAILED DESCRIPTION OF THE EMBODIMENTS

Various embodiments of the inventive concept will be described hereinafter with reference to the accompanying drawings. However, the various embodiments described herein are for illustrative purposes only and are not intended to limit the scope of the inventive concept.

Figure 1:
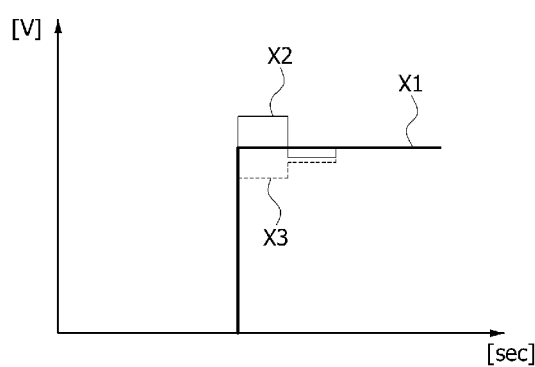
FIG. 1 illustrates waveforms of a transmission signal outputted from a signal transmission circuit according to various electrical resistances of the signal transmission circuit.

FIG. 1 illustrates waveforms of a transmission signal outputted from a signal transmission circuit according to various electrical resistances of the signal transmission circuit.

A signal transmission circuit may drive a transmission signal and may transmit the transmission signal through a transmission channel. In such a case, the transmission signal may be reflected at a receiving stage of the signal transmission circuit, thereby causing a distortion of the transmission signal. Thus, to prevent the transmission signal from being distorted, the signal transmission circuit may control or adjust an electrical resistance thereof to match the impedance of the signal transmission circuit with the impedance of the transmission channel. Referring to FIG. 1, when the electrical resistance of the signal transmission circuit is matched with the impedance of the transmission channel, the transmission signal may be normally transmitted with minimal distortion through the transmission channel as illustrated by a waveform "X1". However, when the electrical resistance of the signal transmission circuit is relatively less than the impedance of the transmission channel, the transmission signal may be transmitted with overshoot as illustrated by a waveform "X2". Alternatively, when the electrical resistance of the signal transmission circuit is relatively greater than the impedance of the transmission channel, the transmission signal may be transmitted with undershoot as illustrated by a waveform "X3".

If a slew rate of the transmission signal increases, a data eye may also increase to obtain high signal integrity. Accordingly, under a condition that the transmission signal is normally transmitted without both the overshoot such as the waveform "X2" and the undershoot such as the waveform "X3," it may be preferable that the electrical resistance of the signal transmission circuit is reduced to increase the slew rate of the transmission signal.

Figure 2:
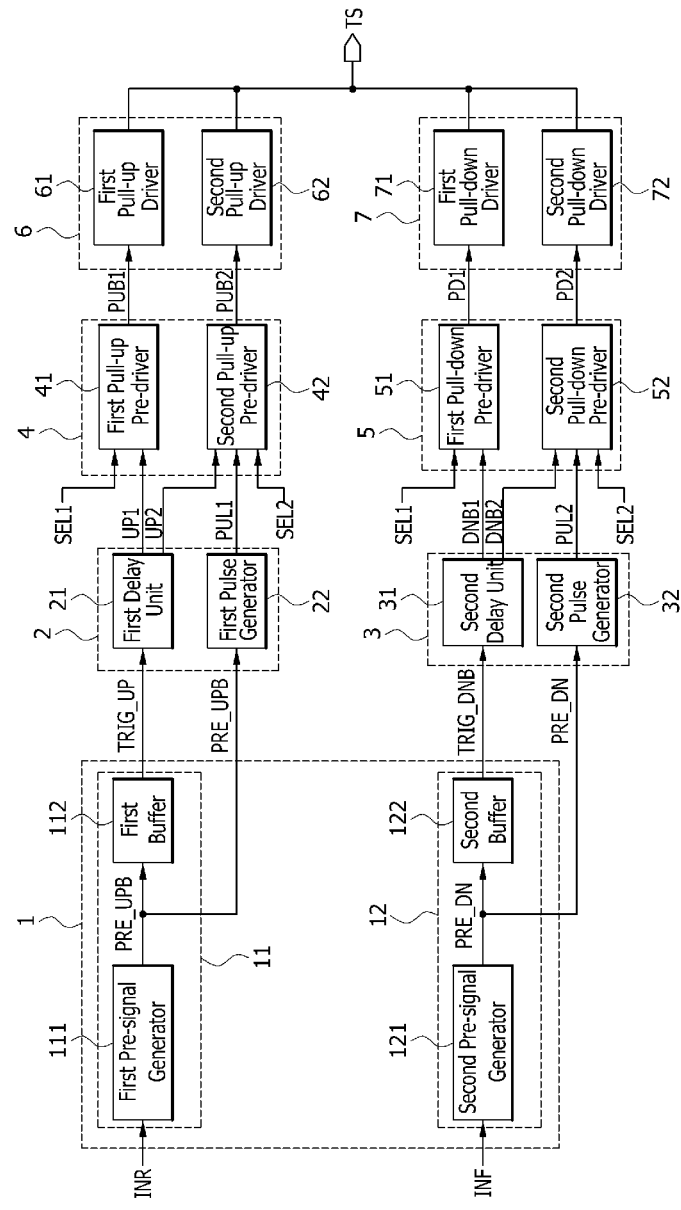
FIG. 2 is a block diagram illustrating a configuration of a signal transmission circuit according to an embodiment.

FIG. 2 is a block diagram illustrating a configuration of a signal transmission circuit according to an embodiment.

As illustrated in FIG. 2, a signal transmission circuit may configured to include an input buffer 1, a first signal processor 2, a second signal processor 3, a pull-up pre-driver 4, a pull-down pre-driver 5, a pull-up driver 6, and a pull-down driver 7.

The input buffer 1 may be configured to include a pull-up input buffer 11 and a pull-down input buffer 12. The pull-up input buffer 11 may be configured to include a first pre-signal generator 111 and a first buffer 112. The pull-down input buffer 12 may be configured to include a second pre-signal generator 121 and a second buffer 122. The first pre-signal generator 111 may generate a first pre-signal PRE_UPB, which is enabled to have a predetermined pulse width, in synchronization with when a first input signal INR is enabled. The first buffer 112 may inversely buffer the first pre-signal PRE_UPB to generate a first trigger signal TRIG_UP. The second pre-signal generator 121 may generate a second pre-signal PRE_DN, which is enabled to have a predetermined pulse width, in synchronization with when a second input signal INF is enabled. The second buffer 122 may inversely buffer the second pre-signal PRE_DN to generate a second trigger signal TRIG_DNB. The first input signal INR may be enabled to output a transmission signal TS having a logic "high" level, and the second input signal INF may be enabled to output the transmission signal TS having a logic "low" level.

The first signal processor 2 may be configured to include a first delay unit 21 and a first pulse generator 22. The first delay unit 21 may retard the first trigger signal TRIG_UP to generate a first up delay signal UP1 and a second up delay signal UP2 which are sequentially enabled. The first pulse generator 22 may receive the first pre-signal PRE_UPB to generate a first pulse signal PUL1 which is enabled to have a predetermined pulse width after a predetermined delay time from when the first pre-signal PRE_UPB is enabled. The first pulse signal PUL1 may be enabled after when the second up delay signal UP2 is enabled. Further, a pulse of the first pulse signal PUL1 may be created such that the first pulse signal PUL1 is disabled after the second up delay signal UP2 is disabled.

The second signal processor 3 may be configured to include a second delay unit 31 and a second pulse generator 32. The second delay unit 31 may retard the second trigger signal TRIG_DNB to generate a first down delay signal DNB1 and a second down delay signal DNB2 which are sequentially enabled. The second pulse generator 32 may receive the second pre-signal PRE_DN to generate a second pulse signal PUL2 which is enabled to have a predetermined pulse width after a predetermined delay time from when the second pre-signal PRE_DN is enabled. The second pulse signal PUL2 may be enabled after when the second down delay signal DNB2 is enabled. Further, a pulse of the second pulse signal PUL2 may be created such that the second pulse signal PUL2 is disabled after the second down delay signal DNB2 is disabled.

The pull-up pre-driver 4 may be configured to include a first pull-up pre-driver 41 and a second pull-up pre-driver 42. The first pull-up pre-driver 41 may generate a first pull-up drive signal PUB1 which is enabled when the first up delay signal UP1 is enabled when a first selection signal SEL1 is enabled to have a logic "high" level. The second pull-up pre-driver 42 may generate a second pull-up drive signal PUB2 which is enabled when the second up delay signal UP2 is enabled when a second selection signal SEL2 is disabled and the first pulse signal PUL1 is disabled. Further, the second pull-up pre-driver 42 may generate the second pull-up drive signal PUB2 which is disabled when the first pulse signal PUL1 is enabled when the second selection signal SEL2 is disabled and the second up delay signal UP2 is enabled. The first and second selection signals SEL1 and SEL2 may be set by a mode register setting operation.

The pull-down pre-driver 5 may be configured to include a first pull-down pre-driver 51 and a second pull-down pre-driver 52. The first pull-down pre-driver 51 may generate a first pull-down drive signal PD1 which is enabled when the first down delay signal DNB1 is enabled when the first selection signal SEL1 is enabled to have a logic "high" level. The second pull-down pre-driver 52 may generate a second pull-down drive signal PD2 which is enabled when the second down delay signal DNB2 is enabled when the second selection signal SEL2 is disabled and the second pulse signal PUL2 is disabled. Further, the second pull-down pre-driver 52 may generate the second pull-down drive signal PD2 which is disabled when the second pulse signal PUL2 is enabled when the second selection signal SEL2 is disabled and the second down delay signal DNB2 is enabled.

The pull-up driver 6 may be configured to include a first pull-up driver 61 and a second pull-up driver 62. The first pull-up driver 61 may pull up the transmission signal TS when the first pull-up drive signal PUB1 is enabled. The second pull-up driver 62 may pull up the transmission signal TS when the second pull-up drive signal PUB2 is enabled. In the present embodiment, on-resistance of the first pull-up driver 61 may be equal to that of the second pull-up driver 62. Thus, drivability of the first pull-up driver 61 for pulling up the transmission signal TS may be equal to that of the second pull-up driver 62. However, the first and second pull-up drivers 61 and 62 may be designed such that the on-resistance of the first pull-up driver 61 is different from that of the second pull-up driver 62.

The pull-down driver 7 may be configured to include a first pull-down driver 71 and a second pull-down driver 72. The first pull-down driver 71 may pull down the transmission signal TS when the first pull-down drive signal PD1 is enabled. The second pull-down driver 72 may pull down the transmission signal TS when the second pull-down drive signal PD2 is enabled. In the present embodiment, on-resistance of the first pull-down driver 71 may be equal to that of the second pull-down driver 72. Thus, drivability of the first pull-down driver 71 for pulling down the transmission signal TS may be equal to that of the second pull-down driver 72. However, the first and second pull-down drivers 71 and 72 may be designed such that the on-resistance of the first pull-down driver 71 is different from that of the second pull-down driver 72.

Figure 3:
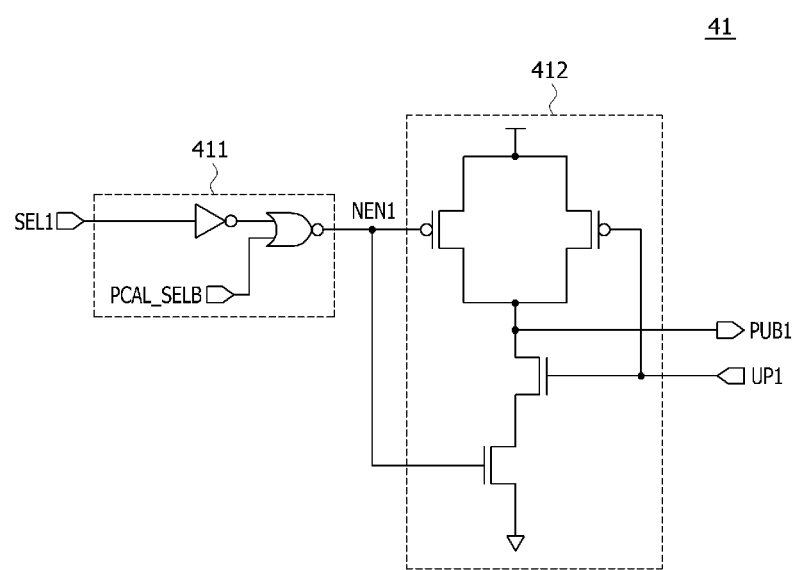
FIG. 3 is a circuit diagram illustrating a configuration of a first pull-up pre-driver included in the signal transmission circuit of FIG. 2.

FIG. 3 is a circuit diagram illustrating a configuration of the first pull-up pre-driver included in the signal transmission circuit of FIG. 2.

As illustrated in FIG. 3, the first pull-up pre-driver 41 may be configured to include a first pull-down enable signal generator 411 and a first pull-up drive signal generator 412. The first pull-down enable signal generator 411 may generate a first pull-down enable signal NEN1 which is enabled to have a logic "high" level when the first selection signal SEL1 is enabled to have a logic "high" level. In FIG. 3, a first calibration signal PCAL_SELB may be enabled to have a logic "low" level when an impedance calibration operation is executed. In the present embodiment, the first calibration signal PCAL_SELB may be enabled to have a logic "low" level. The first pull-up drive signal generator 412 may generate the first pull-up drive signal PUB1 which is enabled to have a logic "low" level when the first up delay signal UP1 is enabled to have a logic "high" level when the first pull-down enable signal NEN1 is enabled to have a logic "high" level.

Figure 4:
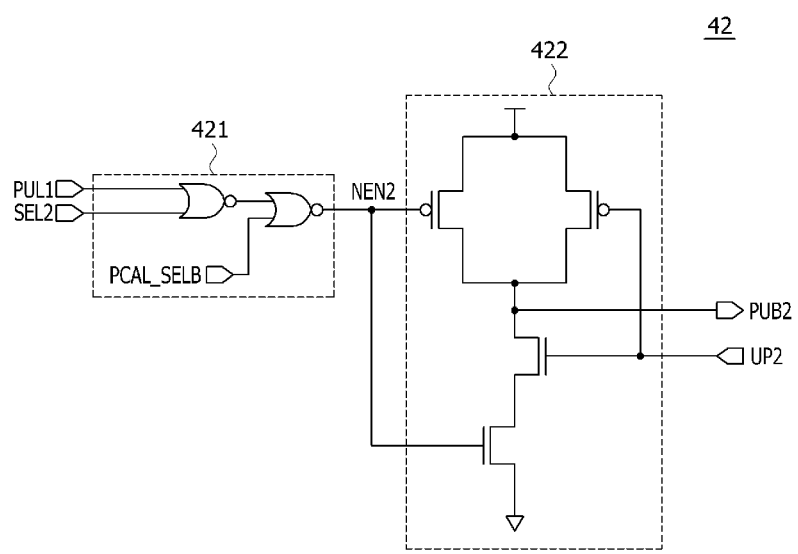
FIG. 4 is a circuit diagram illustrating a configuration of a second pull-up pre-driver included in the signal transmission circuit of FIG. 2.

FIG. 4 is a circuit diagram illustrating a configuration of the second pull-up pre-driver included in the signal transmission circuit of FIG. 2.

As illustrated in FIG. 4, the second pull-up pre-driver 42 may be configured to include a second pull-down enable signal generator 421 and a second pull-up drive signal generator 422. The second pull-down enable signal generator 421 may generate a second pull-down enable signal NEN2 which is enabled to have a logic "high" level when the second selection signal SEL2 is enabled to have a logic "high" level or the first pulse signal PUL1 is disabled to have a logic "high" level. The second pull-up drive signal generator 422 may generate the second pull-up drive signal PUB2 which is enabled to have a logic "low" level when the second up delay signal UP2 is enabled to have a logic "high" level when the second pull-down enable signal NEN2 is enabled to have a logic "high" level.

Figure 5:
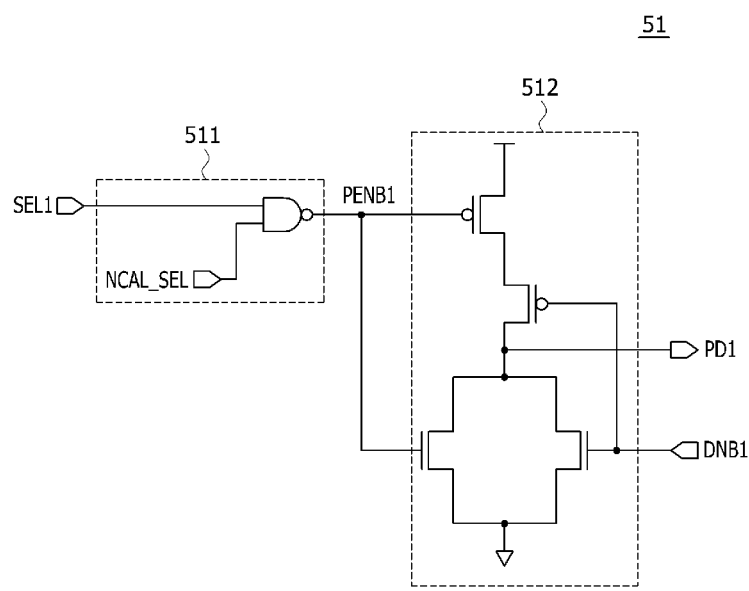
FIG. 5 is a circuit diagram illustrating a configuration of a first pull-down pre-driver included in the signal transmission circuit of FIG. 2.

FIG. 5 is a circuit diagram illustrating a configuration of the first pull-down pre-driver included in the signal transmission circuit of FIG. 2.

As illustrated in FIG. 5, the first pull-down pre-driver 51 may be configured to include a first pull-up enable signal generator 511 and a first pull-down drive signal generator 512. The first pull-up enable signal generator 511 may generate a first pull-up enable signal PENB1 which is enabled to have a logic "low" level when the first selection signal SEL1 is enabled to have a logic "high" level. In FIG. 5, a second calibration signal NCAL_SEL may be enabled to have a logic "high" level when the impedance calibration operation is executed. In the present embodiment, the second calibration signal NCAL_SEL may be enabled to have a logic "high" level. The first pull-down drive signal generator 512 may generate the first pull-down drive signal PD1 which is enabled to have a logic "high" level when the first down delay signal DNB1 is enabled to have a logic "low" level when the first pull-up enable signal PENB1 is enabled to have a logic "low" level.

Figure 6:
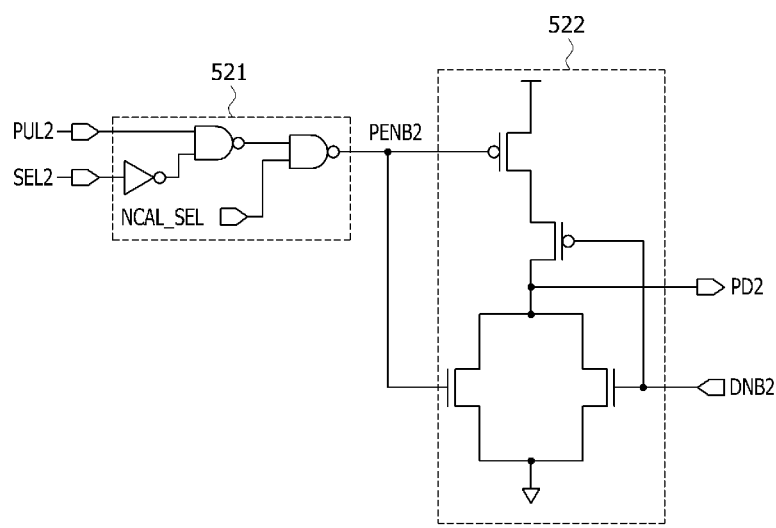
FIG. 6 is a circuit diagram illustrating a configuration of a second pull-down pre-driver included in the signal transmission circuit of FIG. 2.

FIG. 6 is a circuit diagram illustrating a configuration of the second pull-down pre-driver included in the signal transmission circuit of FIG. 2.

As illustrated in FIG. 6, the second pull-down pre-driver 52 may be configured to include a second pull-up enable signal generator 521 and a second pull-down drive signal generator 522. The second pull-up enable signal generator 521 may generate a second pull-up enable signal PENB2 which is enabled to have a logic "low" level when the second selection signal SEL2 is enabled to have a logic "high" level or the second pulse signal PUL2 is disabled to have a logic "low" level. The second pull-down drive signal generator 522 may generate the second pull-down drive signal PD2 which is enabled to have a logic "high" level when the second down delay signal DNB2 is enabled to have a logic "low" level when the second pull-up enable signal PENB2 is enabled to have a logic "low" level.

Hereinafter, an operation of the signal transmission circuit according to the various embodiments will be described under the assumption that both the first and second selection signals SEL1 and SEL2 are enabled to have logic "high" levels.

When the first selection signal SEL1 is enabled to have a logic "high" level, the first pull-up pre-driver 41 may generate the first pull-up drive signal PUB1 which is enabled to have a logic "low" level in synchronization with when the first up delay signal UP1 is enabled to have a logic "high" level. Further, the first pull-down pre-driver 51 may generate the first pull-down drive signal PD1 which is enabled to have a logic "high" level in synchronization with when the first down delay signal DNB1 is enabled to have a logic "low" level.

When the second selection signal SEL2 is enabled to have a logic "high" level, the second pull-up pre-driver 42 may generate the second pull-up drive signal PUB2 which is enabled to have a logic "low" level in synchronization with when the second up delay signal UP2 is enabled to have a logic "high" level. Further, the second pull-down pre-driver 52 may generate the second pull-down drive signal PD2 which is enabled to have a logic "high" level in synchronization with when the second down delay signal DNB2 is enabled to have a logic "low" level.

Since both the first and second pull-up drive signals PUB1 and PUB2 are enabled, both the first and second pull-up drivers 61 and 62 may be turned on to pull up the transmission signal TS. Further, since both the first and second pull-down drive signals PD1 and PD2 are enabled, both the first and second pull-down drivers 71 and 72 may be turned on to pull down the transmission signal TS. When all the first and second pull-up drivers 61 and 62 and the first and second pull-down drivers 71 and 72 are turned on, an electrical resistance of the signal transmission circuit may have a minimum value.

When the first selection signal SEL1 is enabled to have a logic "high" level and the second selection signal SEL2 is disabled to have a logic "low" level, an operation of the signal transmission circuit according to various embodiments will be described more fully with reference to FIGS. 7 and 8.

Figure 7:
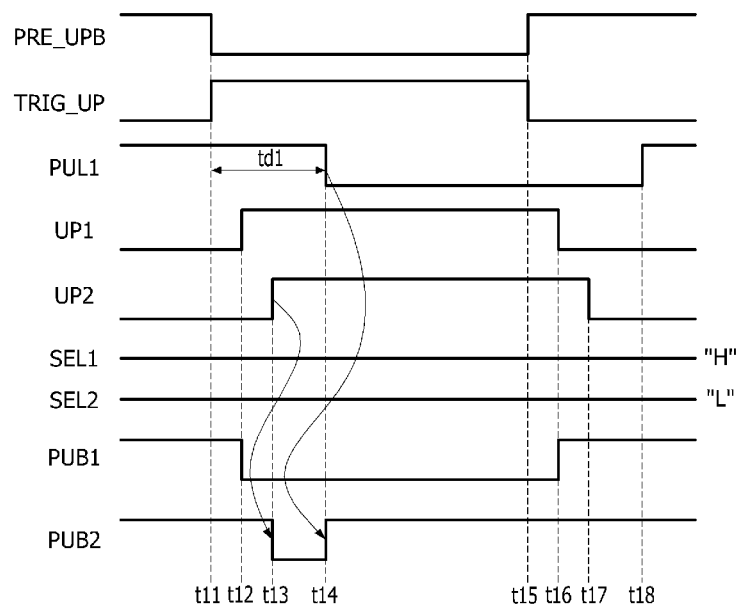
FIGS. 7 and 8 are timing diagrams illustrating operations of the signal transmission circuit shown in FIG. 2.

Referring to FIG. 7, if the first pre-signal PRE_UPB is generated to have a pulse width corresponding to a period between a time "t11" and a time "t15" in synchronization with when the first input signal INR is enabled, the first up delay signal UP1 may be enabled to have a logic "high" level during a period between a time "t12" and a time "t16" and the second up delay signal UP2 may be enabled to have a logic "high" level during a period between a time "t13" and a time "t17". The first pulse signal PUL1 may be enabled to have a logic "low" level during a period from a time "t14", which has been delayed by a first delay period "td1" from when the first trigger signal TRIG_UP generated by inversely buffering the first pre-signal PRE_UPB is enabled, to a time "t18". The time "t18" when the first pulse signal PUL1 is disabled may be set to be later than the time "t17" when the second up delay signal UP2 is disabled to have a logic "low" level. When the first selection signal SEL1 is enabled to have a logic "high" level, the first pull-up pre-driver 41 may generate the first pull-up drive signal PUB1 which is enabled to have a logic "low" level during a period between the time "t12" and the time "t16" in response to the first up delay signal UP1 which is enabled to have a logic "high" level during the period between the time "t12" and the time "t16". When the second selection signal SEL2 is disabled to have a logic "low" level, the second pull-up pre-driver 42 may generate the second pull-up drive signal PUB2 which is enabled to have a logic "low" level during a period between a time "t13" and a time "t14" where the first pulse signal PUL1 is disabled to have a logic "high" level and the second up delay signal UP2 is enabled to have a logic "high" level. The first pull-up driver 61 may be turned on during the period between the time "t12" and the time "t16" in response to the first pull-up drive signal PUB1 which is enabled to have a logic "low" level during the period between the time "t12" and the time "t16". The second pull-up driver 62 may be turned on during the period between the time "t13" and the time "t14" in response to the second pull-up drive signal PUB2 which is enabled to have a logic "low" level during the period between the time "t13" and the time "t14". Accordingly, during the period between the time "t13" and the time "t14", both the first and second pull-up drivers 61 and 62 may be turned on to reduce an electrical resistance of the signal transmission circuit.

Figure 8:
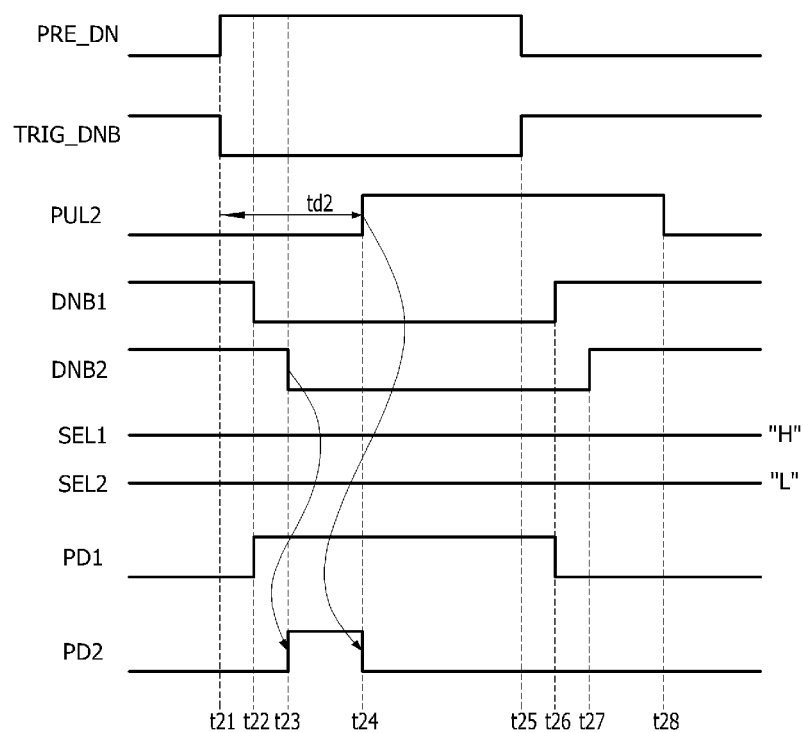

Referring to FIG. 8, if the second pre-signal PRE_DN is generated to have a pulse width corresponding to a period between a time "t21" and a time "t25" in synchronization with when the second input signal INF is enabled, the first down delay signal DNB1 may be enabled to have a logic "low" level during a period between a time "t22" and a time "t26" and the second down delay signal DNB2 may be enabled to have a logic "low" level during a period between a time "t23" and a time "t27". The second pulse signal PUL2 may be enabled to have a logic "high" level during a period from a time "t24", which has been delayed by a second delay period "td2" from when the second trigger signal TRIG_DNB generated by inversely buffering the second pre-signal PRE_DN is enabled, to a time "t28". The time "t28" when the second pulse signal PUL2 is disabled may be set to be later than the time "t27" when the second down delay signal DNB2 is disabled to have a logic "high" level. When the first selection signal SEL1 is enabled to have a logic "high" level, the first pull-down pre-driver 51 may generate the first pull-down drive signal PD1 which is enabled to have a logic "high" level during a period between the time "t22" and the time "t26" in response to the first down delay signal DNB1 which is enabled to have a logic "low" level during the period between the time "t22" and the time "t26". When the second selection signal SEL2 is disabled to have a logic "low" level, the second pull-down pre-driver 52 may generate the second pull-down drive signal PD2 which is enabled to have a logic "high" level during a period between a time "t23" and a time "t24" where the second pulse signal PUL2 is disabled to have a logic "low" level and the second down delay signal DNB2 is enabled to have a logic "low" level. The first pull-down driver 71 may be turned on during the period between the time "t22" and the time "t26" in response to the first pull-down drive signal PD1 which is enabled to have a logic "high" level during the period between the time "t22" and the time "t26". The second pull-down driver 72 may be turned on during the period between the time "t23" and the time "t24" in response to the second pull-down drive signal PD2 which is enabled to have a logic "high" level during the period between the time "t23" and the time "t24". Accordingly, during the period between the time "t13" and the time "t14", both the first and second pull-down drivers 71 and 72 may be turned on to reduce an electrical resistance of the signal transmission circuit.

As described above, even though the second selection signal SEL2 is disabled to have a logic "low" level, both the first and second pull-up drivers 61 and 62 may be turned on during the period from the time "t13" to the time "t14" and both the first and second pull-down drivers 71 and 72 may be turned on during the period from the time "t23" to the time "t24". Thus, even when the second selection signal SEL2 is disabled to have a logic "low" level, an electrical resistance of the signal transmission circuit according to various embodiments may be reduced during a predetermined period as if both the first and second selection signals SEL1 and SEL2 are enabled to have logic "high" levels. That is, as summarized in the table of FIG. 9, the signal transmission circuit may have an electrical resistance of "R/2" when both the first and second selection signals SEL1 and SEL2 are enabled to have logic "high" levels and may still have the electrical resistance of "R/2" during a certain period even if the second selection signal SEL2 is disabled to have a logic "low" level. As such, an electrical resistance of the signal transmission circuit according to various embodiments may be reduced during a certain period even though the second selection signal SEL2 is disabled to have a logic "low" level, thereby improving drivability for the transmission signal TS. As a result, a slew rate of the transmission signal TS may be increased to enhance the signal integrity.

The various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A signal transmission circuit, the circuit comprising:
a pre-driver configured to generate a first drive signal in response to a first delay signal and a first selection signal and to generate a second drive signal in response to a second delay signal, a second selection signal, and a pulse signal; and
a driver configured to output a transmission signal in response to the first and second drive signals,
wherein the first delay signal is output at a second time which is later than a first time when an input signal is received, the second delay signal is output at a third time which is later than the second time, and the pulse signal is output at a fourth time which is delayed by a predetermined delay period from the first time.

2. The circuit of claim 1, wherein the first and second selection signals are set by a mode register setting operation.

3. The circuit of claim 1, wherein the second drive signal is output from the third time to the fourth time when the second selection signal is not output.

4. The circuit of claim 1, wherein the driver includes:
a first driver configured to output the transmission signal when the first drive signal is output; and
a second driver configured to output the transmission signal when the second drive signal is output.

5. The circuit of claim 1, wherein the pre-driver includes:
a first pre-driver configured to generate the first drive signal in response to the first delay signal and the first selection signal; and a second pre-driver configured to generate the second drive signal in response to the second delay signal, the second selection signal, and the pulse signal.

6. The circuit of claim 5, wherein the first drive signal is output when the first delay signal is output, and the first selection signal is enabled also output.

7. The circuit of claim 6, wherein the first pre-driver includes:
a first enable signal generator configured to generate a first enable signal in response to the first selection signal; and
a first drive signal generator configured to generate the first drive signal in response to the first enable signal and the first delay signal.

8. The circuit of claim 5, wherein the second drive signal is output when the second delay signal is output, and the second selection signal is enabled also output, and the second drive signal is output when the pulse signal and the second selection signal are not output, and the second delay signal is output.

9. The circuit of claim 8, wherein the second pre-driver includes:
a second enable signal generator configured to generate a second enable signal in response to the second selection signal and the pulse signal; and
a second drive signal generator configured to generate the second drive signal in response to the second enable signal and the second delay signal.

10. A signal transmission circuit, the circuit comprising:
a pre-driver configured to generate an drive signal when a delay signal is output, and a selection signal is enabled also output, and generate the drive signal when a pulse signal and the selection signal is not output; and the delay signal is output; and
a driver configured to output a transmission signal in response to the drive signal, wherein the pre-driver includes an enable signal generator configured to generate an enable signal in response to the selection signal and the pulse signal, and a drive signal generator configured to generate the drive signal in response to the enable signal and the delay signal.

11. The circuit of claim 10, wherein the selection signal is set by a mode register setting operation.

12. The circuit of claim 10, wherein the delay signal is output at a second time which is later than a first time when an input signal is received and the pulse signal is output at a third time which is delayed by a predetermined delay period from the first time.

13. The circuit of claim 12, wherein the drive signal is output from the second time to the third time when the selection signal is not output.

14. A signal transmission circuit, the circuit comprising:
an input buffer configured to generate a pre-signal and a trigger signal in response to an input signal;
a signal processor configured to generate a pulse signal in response to the pre-signal and to generate a first delay signal and a second delay signal in response to the trigger signal;
a pre-driver configured to generate a first drive signal in response to the first delay signal and a first selection signal and to generate a second drive signal in response to the second delay signal, a second selection signal, and the pulse signal; and
a driver configured to output a transmission signal in response to the first and second drive signals.

15. The circuit of claim 14, wherein the trigger signal and the pre-signal are output in synchronization with a first time when the input signal is output and the trigger signal is generated by buffering the pre-signal.

16. The circuit of claim 15, wherein the signal processor includes:
a delay unit configured to retard the trigger signal to generate a first delay signal which is output at a second time after the first time and to generate a second delay signal which is output at a third time after the second time; and
a pulse generator configured to generate the pulse signal output at a fourth time which is delayed by a predetermined delay time from the first time in response to the pre-signal.

17. The circuit of claim 16, wherein the second drive signal is output from the third time to the fourth time when the second selection signal is not output.

18. The circuit of claim 14, wherein the pre-driver includes:
a first pre-driver configured to generate the first drive signal in response to the first delay signal and the first selection signal; and
a second pre-driver configured to generate the second drive signal in response to the second delay signal, the second selection signal, and the pulse signal.

19. The circuit of claim 18, wherein the first drive signal is output when the first delay signal is output, and the first selection signal is also output.

20. The circuit of claim 19, wherein the first pre-driver includes:
a first enable signal generator configured to generate a first enable signal in response to the first selection signal; and
a first drive signal generator configured to generate the first drive signal in response to the first enable signal and the first delay signal.

21. The circuit of claim 18, wherein the second drive signal is output when the second delay signal is output, and the second selection signal is also output, and the second drive signal is output when the pulse signal and the second selection signal are not output and the second delay signal is output.

22. The circuit of claim 21, wherein the second pre-driver includes:
a second enable signal generator configured to generate a second enable signal in response to the second selection signal and the pulse signal; and
a second drive signal generator configured to generate the second drive signal in response to the second enable signal and the second delay signal.

23. The circuit of claim 14, wherein the driver includes:
a first driver configured to output the transmission signal when the first drive signal is output; and
a second driver configured to output the transmission signal when the second drive signal is output.

* * * * *